United States Patent
Won et al.

(10) Patent No.: US 7,407,897 B2
(45) Date of Patent: Aug. 5, 2008

(54) CAPACITOR OF ANALOG SEMICONDUCTOR DEVICE HAVING MULTI-LAYER DIELECTRIC FILM AND METHOD OF MANUFACTURING THE SAME

(75) Inventors: Seok-jun Won, Seoul (KR); Yong-kuk Jeong, Seoul (KR); Dae-jin Kwon, Suwon-si (KR); Min-woo Song, Seongnam-si (KR); Weon-hong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/173,624

(22) Filed: Jul. 1, 2005

(65) Prior Publication Data

US 2006/0017136 A1    Jan. 26, 2006

(30) Foreign Application Priority Data

Jul. 5, 2004  (KR) ...................... 10-2004-0051974

(51) Int. Cl.
    *H01L 29/00*    (2006.01)
(52) U.S. Cl. ........................ 438/957; 438/253; 257/532; 257/535; 257/310; 257/E21.546; 257/E21.548; 257/E21.645
(58) Field of Classification Search ............... 257/532, 257/535, 310; 438/957, 253
    See application file for complete search history.

(56) References Cited

U.S. PATENT DOCUMENTS

| | | | |
|---|---|---|---|
| 6,341,056 B1 | 1/2002 | Allman et al. ............... 361/312 |
| 6,885,056 B1* | 4/2005 | Dornisch et al. ............ 257/310 |
| 7,091,548 B2 | 8/2006 | Jeong et al. | |
| 2003/0096473 A1* | 5/2003 | Shih et al. .................... 438/240 |
| 2004/0002188 A1 | 1/2004 | Chung ........................ 438/240 |
| 2004/0061157 A1* | 4/2004 | Kiyotoshi et al. ........... 257/296 |
| 2004/0072401 A1* | 4/2004 | Iizuka et al. ................ 438/240 |
| 2004/0079980 A1* | 4/2004 | Hieda ......................... 257/303 |
| 2004/0104420 A1 | 6/2004 | Coolbaugh et al. .......... 257/310 |

(Continued)

FOREIGN PATENT DOCUMENTS

JP          5-21710       *    1/1993

(Continued)

OTHER PUBLICATIONS

Won et al. ("Won") "Novel Plasma Enhanced Atomic Layer Deposition Technology for High-k Capacitor with EOT of 8.ANG. on Conventional Metal Electrode"; 2003 Symposium on VLSI Technology Digest of Technical Papers, 4-89114-035-6/03.*

*Primary Examiner*—Ahmed Sefer
(74) *Attorney, Agent, or Firm*—Mills & Onello LLP

(57) ABSTRACT

In a capacitor of an analog semiconductor device having a multi-layer dielectric film and a method of manufacturing the same, the multi-layer dielectric film can be readily manufactured, has weak reactivity with corresponding electrodes and offers excellent leakage current characteristics. In order to obtain these advantages, a lower dielectric film having a negative quadratic VCC, an intermediate dielectric film having a positive quadratic VCC, and an upper dielectric film having a negative quadratic VCC are sequentially formed between a lower electrode and an upper electrode. The lower dielectric film and the upper dielectric film may be composed of $SiO_2$. The intermediate dielectric film may be composed of $HFO_2$.

9 Claims, 2 Drawing Sheets

U.S. PATENT DOCUMENTS

| | | | |
|---|---|---|---|
| 2004/0232497 A1* | 11/2004 | Akiyama et al. | 257/390 |
| 2005/0064236 A1* | 3/2005 | Lim et al. | 428/690 |
| 2005/0110101 A1* | 5/2005 | Kaneko et al. | 257/410 |
| 2005/0173778 A1* | 8/2005 | Won et al. | 257/532 |
| 2005/0196915 A1* | 9/2005 | Jeong et al. | 438/238 |
| 2005/0260357 A1* | 11/2005 | Olsen et al. | 427/569 |
| 2005/0269649 A1* | 12/2005 | Ping | 257/410 |
| 2006/0223276 A1* | 10/2006 | Lin et al. | 438/393 |

FOREIGN PATENT DOCUMENTS

| | | |
|---|---|---|
| KR | 87-3417 | 5/1988 |
| KR | 1020030079400 | 10/2003 |
| KR | 1020040001486 | 1/2004 |

* cited by examiner

CAPACITOR OF ANALOG SEMICONDUCTOR DEVICE HAVING MULTI-LAYER DIELECTRIC FILM AND METHOD OF MANUFACTURING THE SAME

BACKGROUND OF THE INVENTION

This application claims priority to Korean Patent Application No. 10-2004-0051974, filed on Jul. 5, 2004, in the Korean Intellectual Property Office, the disclosure of which is incorporated herein in its entirety by reference.

1. Field of the Invention

The present invention relates to an analog semiconductor device and a method of manufacturing the same, and more particularly, to an analog semiconductor device having a multi-layer dielectric film and a method of manufacturing the same.

2. Description of the Related Art

Analog capacitors are used in analog-to-digital converters (AD converters), RF devices, switching capacitor filters, CMOS image sensors (CISs), and the like. When a voltage applied to an analog capacitor is changed, the electric charge applied to electrodes surrounding a dielectric film is also changed. Analog capacitors retain signal information that is based on the variation of the electric charge.

In general, when a voltage (V) is applied to a capacitor, the electric charge of the electrodes can be expressed by the following equation:

$$Q = C \times V,$$

where C denotes an electrostatic capacitance, that is, a capacitance, and V is the voltage.

When the capacitance (C) is constant, the electric charge (Q) is linearly proportional to the voltage (V). When the voltage (V) is constant, the electric charge (Q) of the capacitor is linearly proportional to the capacitance (C). Assuming such a linear relationship, the operating voltage range of the capacitor can be quantized into a plurality of steps and each of the quantized voltages can correspond to a bit of a binary number.

In order to obtain a large number of bits from an analog capacitor, the difference in electric charge corresponding to each of the quantized voltages must be large and constant. Therefore, analog capacitors are composed of a dielectric film having the property of an excellent voltage coefficient of capacitance (VCC). A dielectric film with excellent VCC ensures that, when a voltage is applied to the capacitor, the capacitance is almost constant and is sufficiently large, and that leakage current is small.

High integration of analog semiconductor devices results in the requirement for smaller capacitors. With the smaller size, in order to prevent a decrease of capacitance, a high-k dielectric film is used. In this case, the high-k dielectric film is defined as a dielectric film having a dielectric constant of 8 or greater.

Meanwhile, the capacitance of a capacitor generally depends on applied voltage. That is, the capacitance C(V) is a function of an applied voltage (V). The capacitance C(V) can be expressed as:

$$C(V) = C(0) \times (a \times V^2 + b \times (V+1)),$$

where C(0) denotes the capacitance of the capacitor at an applied voltage of 0 V, a denotes a quadratic voltage coefficient of capacitance (VCC), and b denotes a linear VCC.

Accordingly, in order to have a small VCC, a and b each should be 0 or nearly 0, and in particular, a should be nearly 0.

The quadratic coefficient a depends on interfacial characteristics between the electrodes and the dielectric film of a capacitor. That is, when a voltage is applied, when depletion occurs in the electrodes, the quadratic coefficient a becomes negative. On the other hand, when electrons flow to the dielectric film, thereby decreasing the effective thickness of the dielectric film, the quadratic coefficient a becomes positive.

The dielectric film of an analog capacitor is preferably a high-k dielectric film having a small leakage current and a quadratic VCC a having a small absolute value. However, currently, leakage current characteristics and voltage efficiency characteristics for analog capacitor cannot be satisfied by the use of a single high-k dielectric film.

In order to overcome this problem, multi-layer dielectric films have been employed in the manufacture of analog capacitors. An example of such a capacitor is disclosed in "Capacitor with Multi-component Dielectric and Method of Fabricating the Same" (U.S. Pat. No. 6,341,056), by Allman et. al.

However, in such capacitors, reaction between the multi-component dielectric film with the electrodes needs to be reduced. In addition, an improvement in leakage current characteristics at high temperatures, shortening of the manufacturing process of the multi-layer dielectric film, and prevention of contamination in the multi-layer dielectric film are needed.

SUMMARY OF THE INVENTION

The present invention provides a capacitor of a semiconductor device having a multi-layer dielectric film. The multi-layer dielectric film includes an upper dielectric film and a lower dielectric film. The upper dielectric film and the lower dielectric film can be composed of $SiO_2$, to lower reactivity with the electrodes. In addition, since the multi-layer dielectric film is formed in situ, the multi-layer dielectric film can be readily manufactured and contamination in the interface between films can be prevented.

The present invention also provides a method of manufacturing such a capacitor.

In one aspect of the present invention, a capacitor of a semiconductor device with a multi-layer dielectric film includes: a semiconductor substrate; a first interlayer insulator on the substrate; a lower electrode on the first interlayer insulator; a lower dielectric film having a negative quadratic VCC on the lower electrode; an intermediate dielectric film having a positive quadratic VCC on the lower dielectric film; an upper dielectric film having a negative quadratic VCC on the intermediate dielectric film; and an upper electrode on the upper dielectric film.

In one embodiment, the capacitor further comprises a base structure including an analog circuit device on the semiconductor substrate, and the first interlayer insulator is on the base structure.

In another embodiment, the lower dielectric film and the higher dielectric film may comprise silicon oxide ($SiO_2$). The intermediate dielectric film having a positive quadratic VCC may comprise a high dielectric material having a small leakage current selected from $HfO_2$, $ZrO_2$, and $LaO_3$.

In another embodiment, the lower dielectric film, the intermediate dielectric film, and the upper dielectric film may be formed by using in-situ plasma enhanced atomic layer deposition (PEALD).

In another embodiment, each of the lower electrode and the upper electrode is a material selected from the group consisting of Ti, TiN, Ta, TaN, Al, Cu, W, WN, Ir, $IrO_2$, Ru and $RuO_2$.

In another aspect of the present invention, a capacitor of a semiconductor device comprises: a semiconductor substrate; a first interlayer insulator on the substrate; a lower electrode on the first interlayer insulator; a lower dielectric film comprising oxide ($SiO_2$) having a negative quadratic VCC on the lower electrode; an intermediate dielectric film having a positive quadratic VCC formed in-situ on the lower dielectric film; an upper dielectric film comprising oxide ($SiO_2$) having a negative quadratic VCC formed in-situ on the intermediate dielectric film; and an upper electrode composed of a metal material on the upper dielectric film.

In one embodiment, the capacitor further comprises a base structure including an analog circuit device on the semiconductor substrate, and the first interlayer insulator is on the base structure.

In another embodiment, the capacitor further comprises a base structure including an analog circuit device on the semiconductor substrate, and wherein the first interlayer insulator is on the base structure.

In another embodiment, the lower electrode and the upper electrode are composed of TiN.

In another embodiment, the intermediate dielectric film is composed of $HfO_2$.

In another embodiment, the lower dielectric film, the intermediate dielectric film, and the upper dielectric film are formed using a PEALD process.

In another aspect of the present invention, there is provided a method of manufacturing a capacitor of an analog semiconductor device including: forming a base substructure acting as an analog circuit on a semiconductor substrate; forming a first interlayer insulator on the base structure and planarizing the first interlayer insulator; forming a lower electrode connected to the base structure on the first interlayer insulator; forming a lower dielectric film having a negative quadratic VCC on the lower electrode using a PEALD process; forming an intermediate dielectric film having a positive quadratic VCC on the lower dielectric film using a PEALD process; forming an upper dielectric film having a negative quadratic VCC on the intermediate dielectric film using a PEALD process; and forming an upper electrode on the upper dielectric film.

In one embodiment, a pre-treatment may be performed before the lower dielectric film is formed. The pre-treatment may be one of a $NH_3$ plasma treatment and a $NH_3$ heat treatment performed at a temperature of 300-500° C.

In another embodiment, a post-treatment may be performed after the upper dielectric film is formed. The post-treatment may be a plasma treatment or a heat treatment all using a gas selected from the group consisting of $NH_3$, $O_2$, and $O_3$.

In another embodiment, the lower dielectric film and the higher dielectric film may comprise silicon oxide ($SiO_2$). The intermediate dielectric film having a positive quadratic VCC may comprise a high dielectric material having a small leakage current selected from $HfO_2$, $ZrO_2$, and $LaO_3$.

In another embodiment, the lower dielectric film, the intermediate dielectric film, and the upper dielectric film are formed in situ.

In another embodiment, the method further includes: etching the upper electrode; etching the upper dielectric film, the intermediate dielectric film, the lower electrode, and the lower electrode such that the upper dielectric film, the intermediate dielectric film, the lower electrode, and the lower electrode have larger surface areas than the upper electrode; forming a second interlayer insulator on the upper electrode; and forming a contact hole in the second interlayer insulator, and forming a metal interconnection that is connected to the upper electrode and the lower electrode.

In another embodiment, the metal interconnection comprises at least two contact plugs connected to the upper electrode.

According to the present invention, a capacitor of an analog semiconductor device includes an upper dielectric film, a lower dielectric film, and an intermediate dielectric film. The upper dielectric film and the lower dielectric film are composed of a material having a negative quadratic VCC, and the intermediate dielectric film is composed of a material having a positive quadratic VCC. As a result, the dielectric films exhibit low reactivity with electrodes, excellent leakage current characteristics at high temperatures. In addition, since the three dielectric films are formed using in-situ PEALD, the dielectric films can be easily manufactured, and defects in the dielectric films and contamination in the interfaces between the dielectric films can be prevented.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention now will be described more fully with reference to the accompanying drawings, in which exemplary embodiments of the invention are shown. This invention may, however, be embodied in many different forms and should not be construed as being limited to the embodiments set forth herein.

Figure 3:
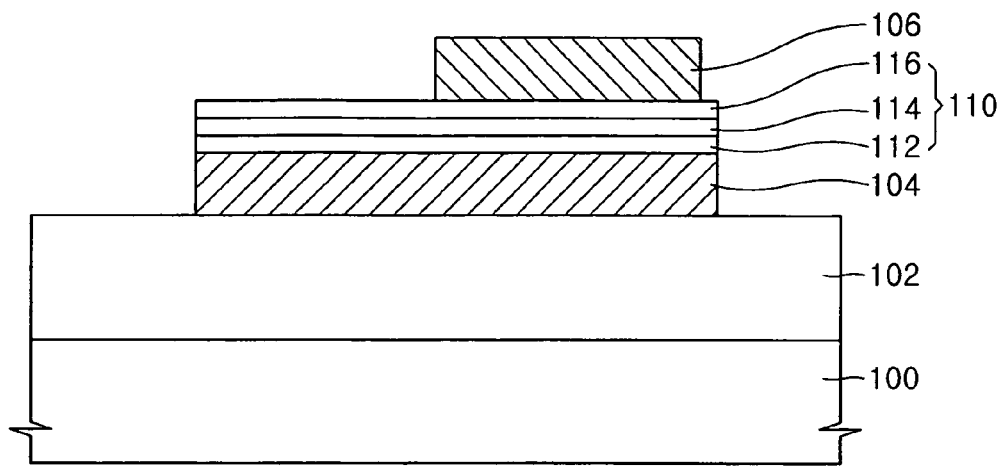

With reference to FIG. 3, a capacitor of an analog semiconductor device having a multi-layer dielectric film according to an exemplary embodiment of the present invention will be described.

The capacitor includes a semiconductor substrate 100 on which a base structure including an analog circuit unit is formed, a lower electrode 104, a lower dielectric film 112, an intermediate dielectric film 114, an upper dielectric film 116, and an upper electrode 106. A first interlayer insulator 102 is interposed between the semiconductor substrate 100 and the lower electrode 104. The lower dielectric film 112 is formed on the lower electrode 104 and has a negative quadratic VCC. The intermediate dielectric film 114 is formed on the lower dielectric film 112, and has a positive quadratic VCC. The upper dielectric film 116 is formed on the intermediate dielectric film 114, and has a negative quadratic VCC. The upper electrode 106 is formed on the upper dielectric film 116.

Dielectric materials that have a negative quadratic VCC and are suitable for use in an analog capacitor include, for example, tantalum pentoxide ($Ta_2O_5$), or silicon oxide ($SiO_2$). The $SiO_2$ material is particularly suitable for use in forming the lower dielectric film 112 and the upper dielectric film 116 according to the present invention since it is less likely to react with the upper electrode 106 and the lower electrode 104 than the $Ta_2O_5$ material, and is excellent for preventing leakage current at high temperatures. In particular, $SiO_2$ has a more enhanced frequency efficiency of capacitor (FCC) parameter and a more enhanced temperature efficiency of capacitor (TCC) parameter than a conventional high-k dielectric material. Therefore, $SiO_2$ exhibits excellent dielectric characteristics for the dielectric material of the present invention.

Dielectric materials that have a positive quadratic VCC and are suitable for use to form the intermediate dielectric film 114 include, for example, $HfO_2$, $ZrO_2$, or $LaO_3$. In particular, the $HfO_2$ material has excellent VCC characteristics and is excellent for preventing leakage current.

Hereinafter, with reference to FIGS. 1 through 4, a method of manufacturing a capacitor of an analog semiconductor device having a multi-layer dielectric film according to an exemplary embodiment of the present invention will be described.

Figure 1:
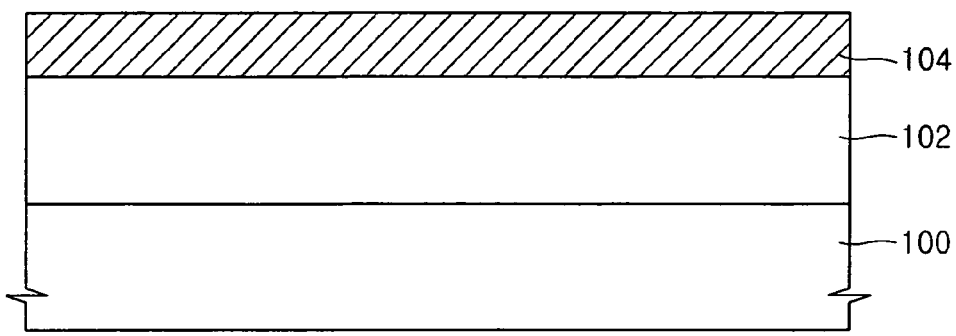
FIGS. 1 through 4 are sectional views illustrating a method of manufacturing a capacitor of an analog semiconductor device with a multi-layer dielectric film according to an embodiment of the present invention.

Referring to FIG. 1, a base structure (not shown) is formed on a semiconductor substrate 100 using a conventional fabricating method. In one example, the base structure functions as an analog circuit. Next, a first interlayer insulator 102 is deposited on the base structure, and then planarized. The first interlayer insulator 102 includes, for example, a single oxide layer or a plurality of oxide layers. Then, a metal material is deposited on the first interlayer insulator 102. The metal material operates as a lower electrode 104 of an analog capacitor. The lower electrode 104 comprises, for example, a material selected from Ti, TiN, Ta, TaN, Al, Cu, W, WN, Ir, $IrO_2$, Ru and $RuO_2$.

The lower electrode 104 is connected to the base structure formed on the semiconductor substrate 100, which is not shown in drawings. In addition, a $NH_3$ plasma treatment or a $NH_3$ heat treatment can be additionally performed at a temperature of 300-500° C. to improve characteristics of the resulting structure before the dielectric film 110 is formed thereon.

Figure 2:
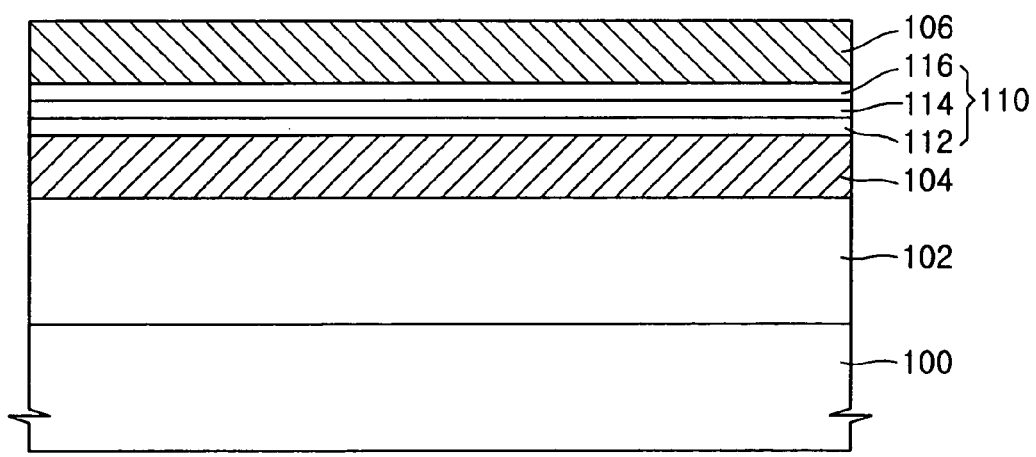

Referring to FIG. 2, a dielectric film 110 is formed on the entire upper surface of the lower electrode 104. The dielectric film 110 is composed of a lower dielectric film 112, an intermediate dielectric film 114, an upper dielectric film 116 sequentially deposited. In one example, the lower dielectric film 112 and the upper dielectric film 116 are composed of a silicon oxide ($SiO_2$) material having a negative quadratic VCC parameter. The intermediate dielectric film 114 is composed of a material selected from $HfO_2$, $ZrO_2$, and $LaO_3$. However, considering VCC characteristics, leakage current characteristics, and ease of forming a thin film, the use of $HfO_2$ is desirable for the intermediate dielectric film 114.

The dielectric film 110 is formed in situ using a plasma enhanced atomic layer deposition (PEALD) method. Formation of the dielectric film 110 by in-situ PEALD is more efficient than a method in which at least two of the dielectric films 112, 114, and 116 are deposited using other methods. In addition, since the three-layered dielectric film 110 is formed in-situ, contamination at the interfaces between the dielectric films 112, 114, and 116 is prevented and defects in the dielectric films 112, 114, and 116 can be minimized.

When the lower dielectric film 112 and the upper dielectric film 116 are formed using PEALD, a catalytic method can be used. In such a case, the amount of impurities in the dielectric film 110 increases. In PEALD used to form the lower dielectric film 104 and the upper dielectric film 106, HCDSO is used as a source at a chamber temperature of 200-300° C. and at a chamber pressure of 2-4 torr. Post-treatment can be additionally performed to decrease the impurities included in the lower dielectric film 112 and the upper dielectric film 116. The post-treatment may comprise a plasma treatment or a heat treatment using a gas selected from $NH_3$, $O_2$, and $O_3$. The post-treatment is performed, for example, at a temperature of 300-500° C.

Subsequently, a metal material is deposited on the entire upper surface of the dielectric film 110. The metal material operates as an upper electrode 106. The upper electrode 106 is, for example, composed of a metal material selected from Ti, TiN, Ta, TaN, Al, Cu, W, WN, Ir, $IrO_2$, Ru, and $RuO_2$.

Referring to FIG. 3, the entire upper surface of electrode 106 is coated with a photoresist, patterning is performed, and then the upper electrode 106 is etched. The resultant structure is then coated with another photoresist, patterning is performed, and the dielectric film 110 and the lower electrode 104 are etched. At this time, the etched lower electrode 104 may have a larger surface area than the etched upper electrode 106.

Figure 4:
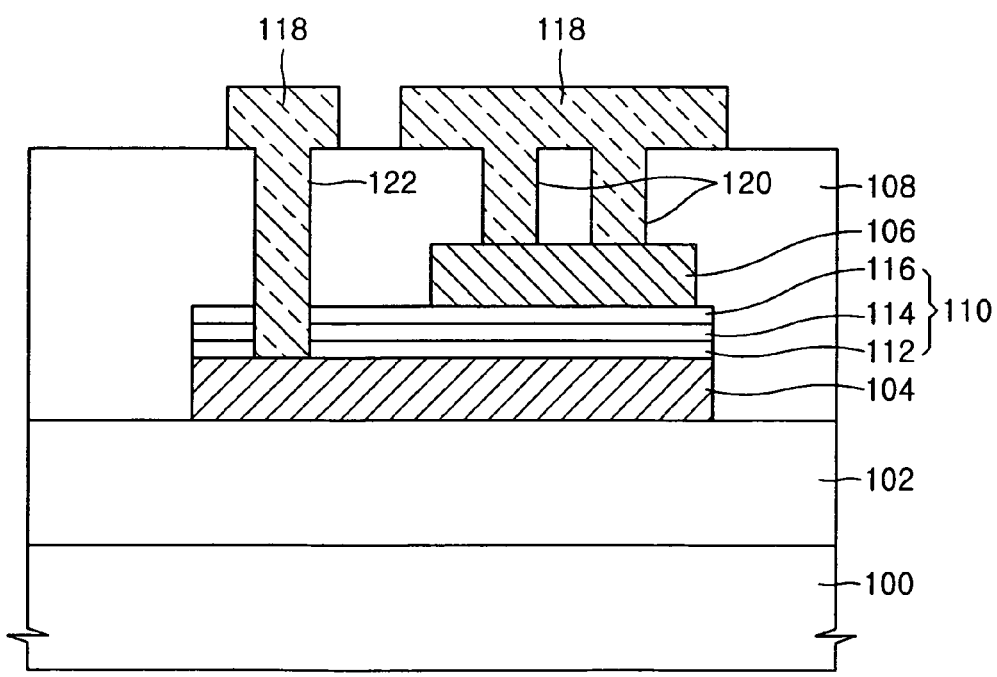

Referring to FIG. 4, after the etching of the dielectric film 100 and the lower electrode 104 is completed, a second interlayer insulator 108 is formed on the entire surface of the resultant semiconductor substrate, and planarized. The second interlayer insulator 108 may include a single oxide layer or a plurality of oxide layers. Then, patterning is performed on the second interlayer insulator 108. As a result, a plurality of contact holes 120 exposing the upper electrode 106 and a contact hole 122 exposing the lower electrode 104 are formed. The contact holes 120 exposing the upper electrode 106 are filled by contact plugs and the contact hole 122 exposing the lower electrode 102 is filled by a contact plug. Metal interconnections 118 are then formed, a first of which is connected to the contact plugs 120 for the upper electrode 106 and a second of which is connected to the contact plug for the lower electrode 104.

According to the present invention, a capacitor of an analog semiconductor device includes an upper dielectric film, a lower dielectric film, and an intermediate dielectric film. The upper dielectric film and the lower dielectric film are composed of a material having a negative quadratic VCC, and the intermediate dielectric film is composed of a material having a positive quadratic VCC. As a result, the dielectric films exhibit low reactivity with the electrodes, and further exhibit excellent leakage current characteristics at high temperatures. In addition, since the three dielectric films are formed using in-situ PEALD, the dielectric films can be readily manufactured and protected from the introduction of defects, and contamination at the interfaces between the dielectric films can be prevented.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A method of manufacturing a capacitor of a semiconductor device comprising:

forming a first interlayer insulator on a semiconductor substrate and planarizing the first interlayer insulator;

forming a lower electrode on the first interlayer insulator;

forming a lower dielectric film having a negative quadratic VCC on the lower electrode in situ using a plasma enhanced atomic layer deposition (PEALD) process;

forming an intermediate dielectric film having a positive quadratic VCC on the lower dielectric film in situ using a PEALD process;

forming an upper dielectric film having a negative quadratic VCC on the intermediate dielectric film in situ using a PEALD process, wherein the PEALD process used to form the lower dielectric film and the upper dielectric film in situ uses a source comprising hexachlorodisiloxane (HCDSO);

forming an upper electrode on the upper dielectric film;
patterning the upper electrode to expose a portion of the upper dielectric film;
patterning a portion of the exposed upper dielectric film, intermediate dielectric film, and lower dielectric film to expose a portion of the lower electrode; and
forming a second interlayer insulator on exposed portions of the upper electrode, upper dielectric film, and lower electrode.

2. The method of claim 1, wherein the lower dielectric film and the upper dielectric film each comprise silicon oxide (SiO2).

3. The method of claim 1, wherein the intermediate dielectric film comprises a high dielectric material selected from the group consisting of HfO2, ZrO2, and LaO3.

4. The method of claim 1, further comprising performing a pre-treatment before the forming of the lower dielectric film.

5. The method of claim 4, wherein the pre-treatment is one of a NH3 plasma treatment and a NH3 heat treatment performed at a temperature of 300 to 500° C.

6. The method of claim 1,
wherein the patterning the upper dielectric film, the intermediate dielectric film, the lower dielectric film, and the lower electrode includes making the upper dielectric film, the intermediate dielectric film, the lower dielectric film, and the lower electrode have larger surface areas than the upper electrode;
and the method further comprises:
forming a set of contact holes in the second interlayer insulator, and forming a metal interconnection that is connected to the upper electrode and the lower electrode.

7. The method of claim 6, wherein the metal interconnection comprises at least two contact plugs connected to the upper electrode.

8. A method of manufacturing a capacitor of a semiconductor device, comprising:
forming a first interlayer insulator on a semiconductor substrate and planarizing the first interlayer insulator;
forming a lower electrode on the first interlayer insulator;
forming a lower dielectric film having a negative quadratic VCC on the lower electrode in situ using a plasma enhanced atomic layer deposition (PEALD) process;
forming an intermediate dielectric film having a positive quadratic VCC directly on the lower dielectric film in situ using a PEALD process;
forming an upper dielectric film having a negative quadratic VCC directly on the intermediate dielectric film in situ using a PEALD process, wherein the PEALD process used to form the lower dielectric film and the upper dielectric film in situ uses a source comprising hexachlorodisiloxane (HCDSO);
forming an upper electrode on the upper dielectric film;
patterning the upper electrode to expose a portion of the upper dielectric film;
patterning a portion of the exposed upper dielectric film, intermediate dielectric film, and lower dielectric film to expose a portion of the lower electrode;
forming a second interlayer insulator on exposed portions of the upper electrode, upper dielectric film, and lower electrode; and
performing a post-treatment after forming of the upper dielectric film.

9. The method of claim 8, wherein the post-treatment is a plasma treatment or a heat treatment using a gas selected from the group consisting of $NH_3$, $O_2$, and $O_3$.

* * * * *